(12) United States Patent
Otsubo et al.

(10) Patent No.: US 8,794,808 B2
(45) Date of Patent: Aug. 5, 2014

(54) ILLUMINATION DEVICE WITH A FLEXIBLE PRINTED CIRCUIT BOARD

(75) Inventors: Takayuki Otsubo, Shizuoka (JP); Takashi Matsunaga, Shizuoka (JP); Noriaki Ito, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 122 days.

(21) Appl. No.: 13/346,481

(22) Filed: Jan. 9, 2012

(65) Prior Publication Data

US 2012/0182753 A1 Jul. 19, 2012

(30) Foreign Application Priority Data

Jan. 14, 2011 (JP) .................. 2011-005883

(51) Int. Cl.
 *F21V 21/00* (2006.01)
 *B60Q 1/00* (2006.01)
(52) U.S. Cl.
 USPC ............ 362/544; 362/85; 362/459; 362/549; 362/249.02; 361/722
(58) Field of Classification Search
 USPC .................. 362/544, 547, 549, 264
 See application file for complete search history.

(56) References Cited

U.S. PATENT DOCUMENTS 5,266,746 A * 11/1993 Nishihara et al. ............. 174/254
5,309,316 A * 5/1994 Yagi et al. ...................... 361/749
6,000,950 A * 12/1999 Kajinuma ........................ 439/60
2006/0160410 A1* 7/2006 Idenishi ........................ 439/495
2006/0281361 A1* 12/2006 Uchida et al. ................. 439/492
2007/0014122 A1* 1/2007 Sakiyama et al. ............. 362/501
2007/0182677 A1* 8/2007 Lee et al. .......................... 345/82
2007/0290965 A1* 12/2007 Shiraishi ......................... 345/87
2008/0101070 A1* 5/2008 Chou ............................. 362/249
2009/0032295 A1* 2/2009 Okajima et al. .............. 174/260
2009/0224645 A1 9/2009 Ichikawa et al.

FOREIGN PATENT DOCUMENTS

| CN | 1808780 A | | 7/2006 |
| CN | 101153693 A | | 4/2008 |
| CN | 101161039 A | | 4/2008 |
| JP | 55013977 A | * | 1/1980 |
| JP | 02188994 A | * | 7/1990 |
| JP | 2006085928 A | * | 3/2006 |
| JP | 3127995 U | | 11/2006 |
| JP | 2008-155751 A | | 7/2008 |
| KR | 10-2009-0054898 | | 6/2009 |

OTHER PUBLICATIONS

Machine English translation of JP2006085928 to Ishikawa et al.*

* cited by examiner

*Primary Examiner* — Sikha Roy
(74) *Attorney, Agent, or Firm* — DLA Piper LLP (US)

(57) ABSTRACT

An illumination device including a light emitting element and a lighting control circuit on a metal base flexible printed circuit board (FPC) that is formed by integrating a flexible metal base with a flexible printed circuit board which is formed by integrating a copper foil pattern (conductive body) with films, wherein end portions of the metal base FPC are formed as thick terminal portions so that the end portions are thicker than the metal base FPC.

12 Claims, 6 Drawing Sheets

ILLUMINATION DEVICE WITH A FLEXIBLE PRINTED CIRCUIT BOARD

BACKGROUND OF THE INVENTION

1. Field of the Invention

The present invention relates to an illumination device with a low manufacturing cost and having a light emitting element whose durability is not likely to decrease.

2. Description of the Related Art

Japanese Patent Application Laid-Open (Kokai) No. 2008-155751 illustrates an illumination device that utilizes an LED. In the illumination device of this art, a flexible printed circuit board mounted with an LED is stored on an inner side of a case body. The case body includes an oblong cylindrical connector housing portion and is attached to a cover, The flexible printed circuit board is configured by a base portion, a bendable extra length portion, and a card edge connector. The base portion is mounted with the LED, a resistance, a diode, and the like. The extra length portion is provided on the base portion, and the card edge connector is provided on a distal end portion of the extra length portion. In a state with the base portion fixed inside the case body, the extra length portion is bent so as to be arranged and fixed at a predetermined position on the connector housing, so that the card edge connector functions as a connector terminal.

Figure 1:
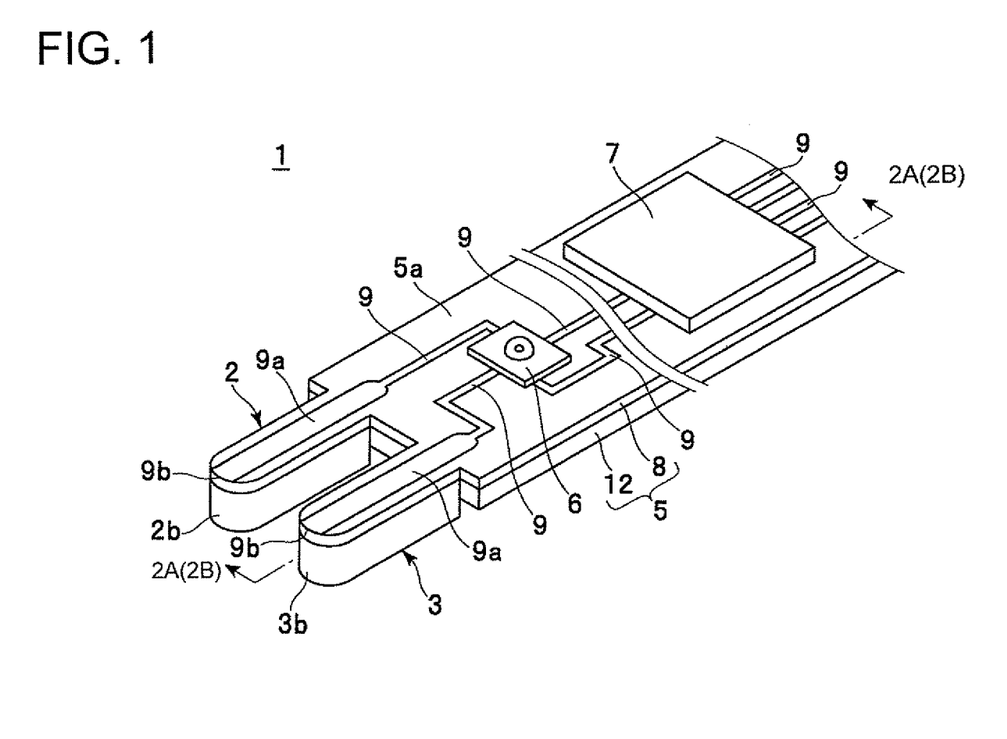
FIG. 1 is a perspective view of an illumination device according to the first embodiment of the present invention.

In the illumination device of the Japanese Patent Application Laid-Open (Kokai) No, 2008-155751, a certain strength is required or the base portion and card edge connector of the flexible printed circuit board so as to be reliably fixed to the case body portion and the connector housing, respectively, and further to ensure that the card edge connector does not bend when used as a terminal. However, the extra length portion that connects the connector housing to the case body portion requires flexibility in order to freely dispose the card edge connector inside the connector housing. Therefore, in the flexible printed circuit board of the Japanese Patent Application Laid-Open (Kokai) No, 2008-155751, as shown in FIG. 1, it is necessary to join the base portion and the card edge connector having the same thickness using the extra length portion, which is a separate member having flexibility. However, forming the base portion, the extra length portion, and the card edge connector all as separate joined members leads to an increase in the manufacturing cost of the flexible printed circuit board.

Meanwhile, the base portion of the Japanese Patent Application Laid-Open
(Kokai) No. 2008-155751, which is an LED-mounting board, is generally formed of resin and thus the heat dissipation performance is low. In this board having a low heat dissipation performance, heat can remain trapped in the LED mounted on the board, thus lowering the durability of the LED. Therefore, a higher heat dissipation performance is required for the LED-mounting board.

BRIEF SUMMARY OF THE INVENTION

In view of the foregoing problems, it is an object of the invention of the present application to provide an illumination device with a low manufacturing cost and having a light emitting element whose durability is not likely to decrease.

The above object is accomplished by a unique structure of the present invention for an illumination device that includes at least one of a light emitting element and a lighting control circuit provided on a metal base flexible printed circuit board (or FPC), which is integrally comprised of a metal base having flexibility and a flexible printed circuit board that is formed by integrating a conductive body and a film, and in the present invention the end portion of the metal base FPC is formed as a thick terminal portion so that the end portion is greater in thickness than the metal base FPC.

According to the illumination device of the present invention as described above, the end portion of the metal base FPC makes a thick terminal portion; accordingly, the metal base FPC has a terminal portion with a sufficient strength. In addition, since the heat generated by the light emitting element during light emission is radiated to the metal base from the FPC board, the heat is not trapped in the light emitting element.

In the above-described the illumination device of the present invention, the thick terminal portion can be made by way of bending the end portion of the metal base FPC.

The metal base FPC that integrates an FPC with a high-strength metal base is easy to bend and easily maintains the bent state. Since in the present invention the end portion of the metal base FPC can be held in a folded over state, the end portion of the metal base FPC can be integrally formed with the thick terminal portion.

In addition, according to the illumination device of the present invention, the end portion of the metal base FPC can be provided with a cutout portion.

The cutout portion facilitates bending of the end portion of the metal base FPC.

Furthermore, according to the illumination device of the present invention, the metal base FPC can be integrated with a resin holding member integrally having a connector housing portion, and the thick terminal portion is disposed on the inner side of the connector housing portion.

In this structure, since the thick terminal portion is disposed on the inner side of the connector housing portion, the thick terminal portion can be protected further, and the illumination device that is integrally provided with a connector is easily formed.

Still further, according to the illumination device of the present invention, the metal base FPC can be bent so as to follow the (convex and concave) shape of the lens of a vehicular lamp and integrated with the back surface side of the lens.

In this structure, since the metal base FPC including the light emitting element is held in a bent configuration while maintaining the sufficient strength, the illumination device can be simply formed by integrating the metal base FPC with the lens.

As can be seen from the above, according to the illumination device of the present invention, the cost of the illumination device can be reduced since the metal base FPC integrally formed with the thick terminal portion that is not easily bent can be obtained. In addition, according to the illumination device of the present invention, there is no decrease in the durability of the light emitting element since the heat is not trapped in the light emitting element.

According to the illumination device of the present invention, the cost of the illumination device can be reduced since the metal base FPC is integrally formed with the thick terminal portion.

According to the illumination device of the present invention, the cost of the illumination device can be reduced in a simpler manner because the thick terminal portion can be easily formed.

According to the illumination device of the present invention, the illumination device that is easily connected to a conductive cable can be obtained at low cost.

According to the illumination device of the present invention, the illumination device can be obtained at low cost thanks to its simpler configuration.

DETAILED DESCRIPTION OF THE INVENTION

Here, the first embodiment of an illumination device according to the present invention will be described based on FIGS. 1, 2A and 2B.

FIG. 1 shows an illumination device according to the present embodiment. The illumination device 1 of FIG. 1 is used in a vehicular lamp and is configured from a metal base FPC (flexible printed circuit board) 5, a light emitting element (LED) 6, and a lighting control circuit 7.

The metal base FPC 5 is provided with a pair of terminal portions 2 and 3.

The terminal portions 2 and 3 are parallel projection-like portions that are parallel to each other and integrally formed by processing end portions of the metal base FPC 5 so as to project along the front surface 5a of the metal base FPC 5. The terminal portions 2 and 3 are also formed thickly. In other words, the terminal portions 2 and 3 are greater in thickness than the metal base FPC 5. The terminal portions (electrodes) can be three in number instead of two as shown in FIG. 1, although the number of the electrodes is not limited to two or three.

The metal base FPC 5 is formed from an FPC (flexible printed circuit board) film 8 and a metal base 12. As shown in FIG. 2B, the FPC film 8 is formed by integrating a copper foil pattern (conductive body) 9 having a circuit wiring configuration between a thermal conductive insulating film 10 and a highly reflective insulating film 11 such that the thermal conductive insulating film 10 is on the back-surface side of the copper foil pattern 9 and the highly reflective insulating film 11 is on the front-surface side of the copper foil pattern 9. Two distal end portions of the copper foil pattern 9 are integrally provided with broadly-formed copper foil terminals 9a, respectively. Distal end portions 9b of the copper foil terminals 9a are disposed so as to be aligned (vertically in the drawings) with distal end portions 2b and 3b of the terminal portions 2 and 3, respectively. (The highly reflective insulating film 11 on the terminal portions 2 and 3, which are formed by processing the metal base FPC 5, is removed to expose the copper foil terminals 9a).

The metal base FPC 5 is mounted with the light emitting element 6 and the lighting control circuit 7. The light emitting element 6 and the lighting control circuit 7 are connected by the copper foil pattern 9 and are further connected to a power supply mechanism (not shown). The metal base FPC 5 can be mounted with either one of the light emitting element 6 and the lighting control circuit 7, and the other of the light emitting element 6 and the lighting control circuit 7 can be mounted on a separate board or the like and electrically connected to the metal base FPC 5 (likewise for the other embodiments described below).

The FPC film 8 has flexibility since the copper foil pattern 9, the thermal conductive insulating film 10, and the highly reflective insulating film 11 have respective thicknesses of approximately 20μm to 40μm.

Meanwhile, the metal base 12 is formed by a thick copper foil 13 and a thermal conductive insulating film 14 which is integrated to the back surface of the thick copper foil 13. The copper foil 13 is greater in thickness than the thermal conductive insulating film 14. In the metal base FPC 5, the front surface of the metal base 12 (or the thick copper foil 13 thereof) and the back surface of the FPC film 8 (or the thermal conductive insulating film 10 thereof) are integrated by vacuuming. The metal base 12 has flexibility since the thick copper foil 13 has a thickness of approximately a hundred and several tens of μm and the thermal conductive insulating film 14 has a thickness of approximately several tens of μm to a hundred and several tens The metal base FPC 5, due to the thickness of the FPC film 8 and the thickness of the metal base 12, has an overall thickness of approximately 300μm.

Figure 2A:
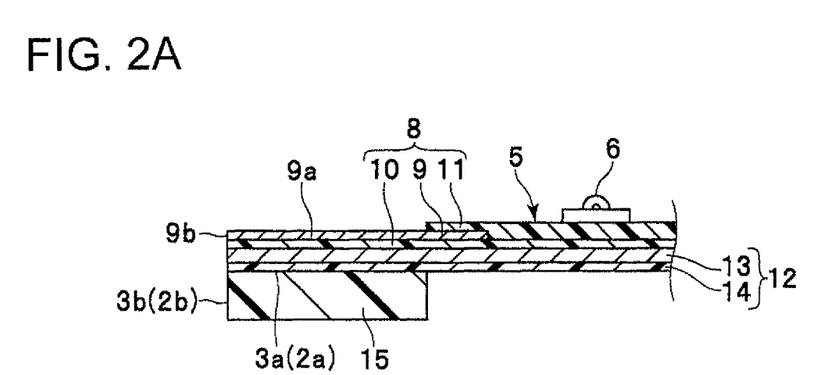
FIG. 2A is a partial cross-sectional view taken along the line 2A-2A in FIG. 1 (the lighting control circuit 7 is not shown therein)
Figure 2B:
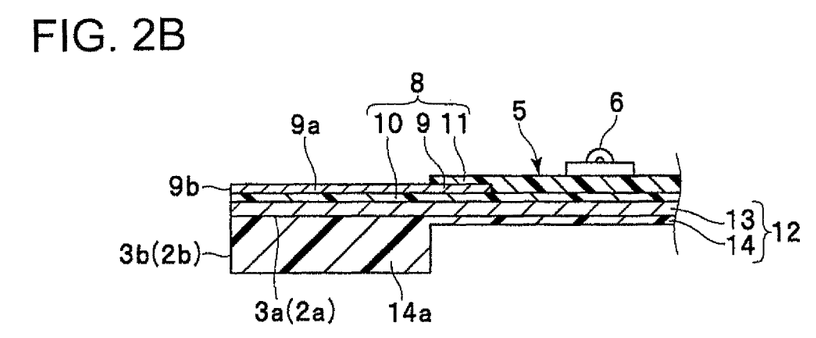
FIG. 2B is a partial cross-sectional view taken along the line 2B-2B in FIG. 1, being similar to FIG. 2A and showing a modification of a thick terminal portion.

As shown in FIG. 2A, the terminal portions 2 and 3 are thickly formed by applying a resin 15, which is an example of a member having an insulation property, to the back surfaces 2a and 3a of the terminal portions 2 and 3. In other words, the terminal portions 2 and 3 are greater in thickness than the metal base FPC 5 by being provided with the resins 15. The resins 15 have a thickness of approximately 300μm. In the structure of FIG. 2B, part of the thermal conductive insulating film 14 disposed on the back surfaces 2a and 3a of the terminal portions 2 and 3 is formed thicker than the rest of the insulating film 14 to make a thick portion 14a having a thickness of approximately 300μm. The terminal portions 2 and 3 are thickly formed so as to have a thickness of approximately 600μm each in both structures shown in FIGS. 2A and 2B.

Figure 5A:
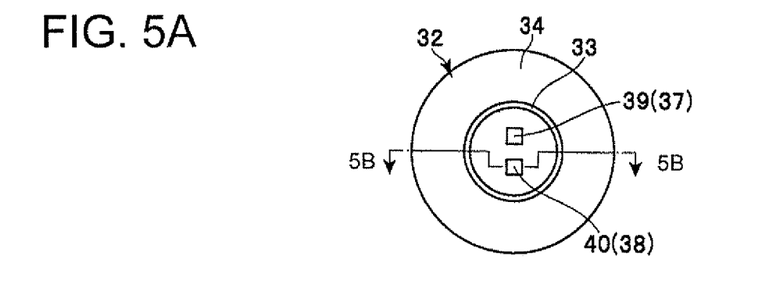
FIG. 5A is a frontal view of the illumination device according to the fourth embodiment of the present invention with the metal base FPC formed by insert molding on a resin holding member.
Figure 5B:
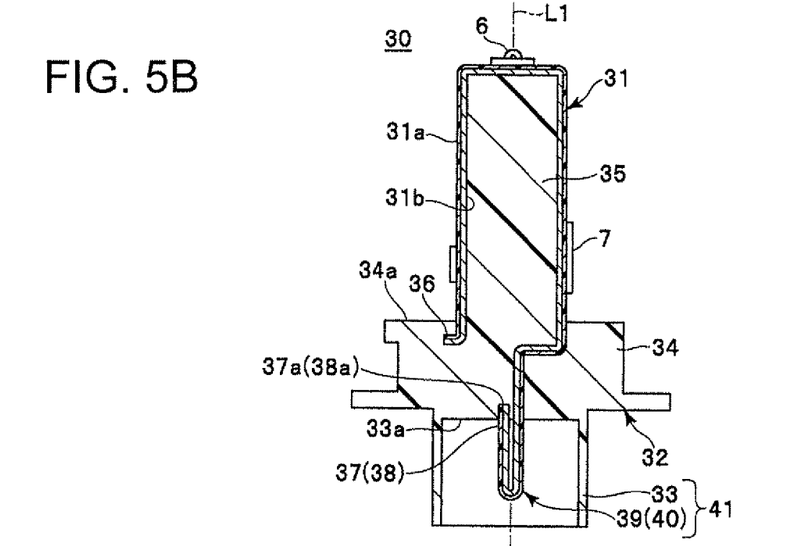
FIG. 5B is a cross-sectional view taken along the line 5B-5B in FIG. 5A.
Figure 5C:
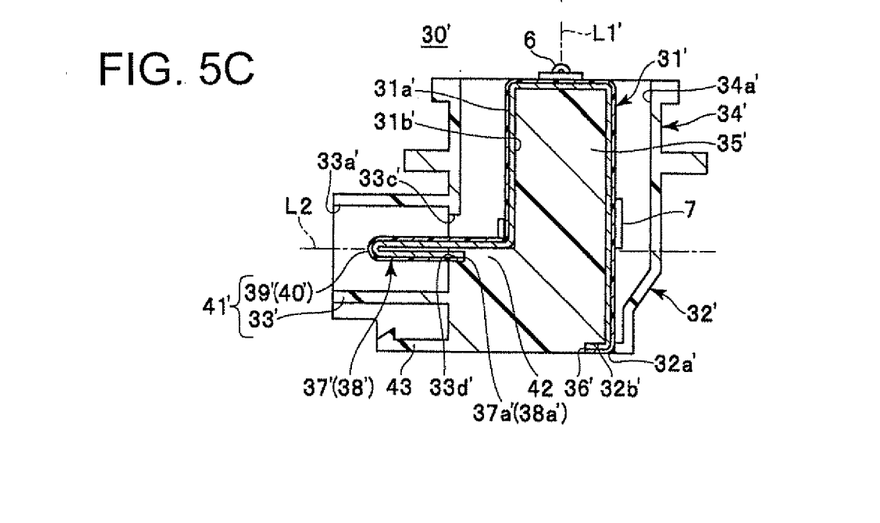
FIG. 5C is a cross-sectional view that shows a modification of FIG. 5B.

The terminal portions 2 and 3, together with a connector housing portion 33 that is shown in FIGS. 5A through 5C and will be described later, form a connecting portion (not shown) (likewise in the second to the fifth embodiments described later). By being thickly formed, the terminal portions 2 and 3 have a strength so that they are not likely to bend. In addition, the durability of the light emitting element 6 improves because the heat generated in the FPC 8 is dissipated from the metal base 12 that is on the back-surface side of the metal base FPC 5.

Next, the illumination device according to the second embodiment of the present invention will be described based on FIGS. 3A to 3C.

The illumination device 20 according to the second embodiment has terminal portions 21 and 22 of a different shape from those in the first embodiment, but otherwise it has the same configuration as that of the illumination device 1 according to the first embodiment. In this second embodiment as well, the number of the terminal portions (electrodes) can be three instead of two, although the number of the electrodes is not limited to two or three. The terminal portions 21 and 22 are thickly formed by processing the end portions of the metal base FPC 5 into a pair of long (or elongated), parallel projection type end portions and folding back the projection type end portions in the thickness direction of the metal base FPC 5.

More specifically, the terminal portions 21 and 22 are formed as follows. As shown in FIG. 3B, first, a pair of elongated projection portions 21a and 22a are formed on the metal base FPC 5. The pair of projection portions 21a and 22a are integrally formed by processing the end portions of the metal base FPC 5 so as to project along the front surface 5a of the metal base FPC 5. Similar to the first embodiment, the distal end portions of the copper foil pattern 9 that connect the light emitting element 6, the lighting control circuit 7 (not shown in the figures of the second embodiment) and the power supply mechanism (not shown) are integrally provided with the broadly-retained copper foil terminals 9a. The distal end portions 9b of the copper foil terminals 9a are disposed so as to be aligned (vertically in the drawings) with distal end portions 22c of the projection portions 21a and 22a, respectively. It should be noted that the highly reflective insulating film 11 on the terminal portions 21 and 22, which are formed by processing the metal base FPC 5, is removed to expose the copper foil terminals 9a, similar to the first embodiment. The projection portions 21a and 22a are formed parallel to each other.

Figure 3A:
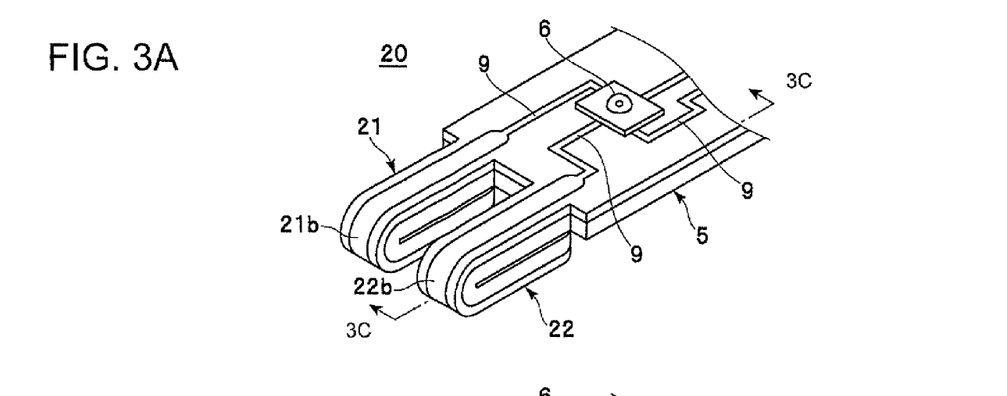
FIG. 3A is a perspective view of the illumination device according to the second embodiment of the present invention.

The projection portions 21a and 22a are respectively formed on the terminal portions 21 and 22 of FIG. 3A by bending (or bringing) the distal end portions 22c of the projection portions 21a and 22a approximately 180 degrees toward the back surface 5b of the metal base FPC 5 (in the direction of reference symbols R1 in FIG. 3B), using center portions 21b and 22b in the lengthwise direction as folding points. Because the terminal portions 21 and 22 are bent and formed to have a thickness double that of the metal base FPC 5, the terminal portions 21 and 22 have sufficient strength so that they are not likely to bend. In addition, by the folding, the copper foil terminals 9a are exposed on both the front surface 5a side and the back surface 5b side of the metal base FPC 5, the conductivity of the terminal portions 21 and 22 improves. In this illumination device 20 shown in FIGS. 3A to 3C, since the terminal portions 21 and 22 are formed by way of bending a part of the metal base FPC 5, lower costs due to a reduced number of parts and better manufacturability can be resulted.

Figure 3B:
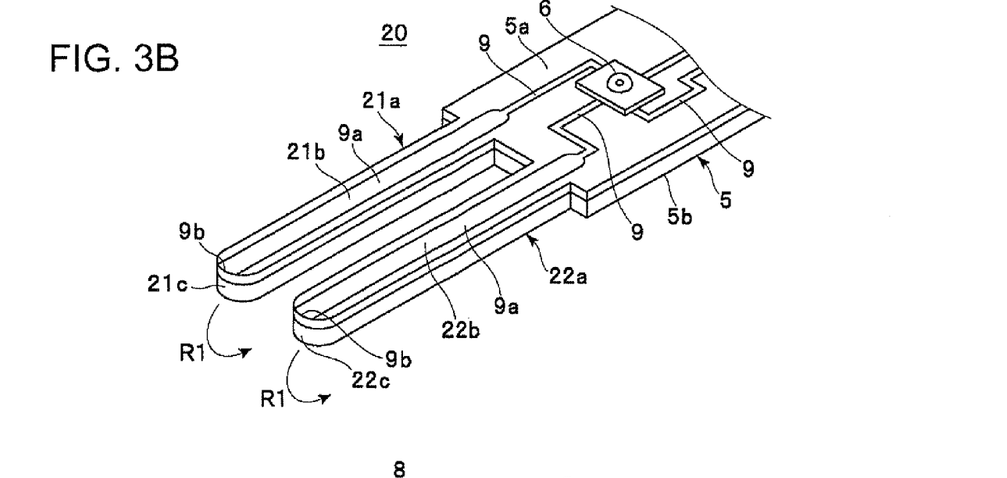
FIG. 3B is a perspective view that shows a metal base FPC of the second embodiment before forming a thick terminal portion.
Figure 3C:
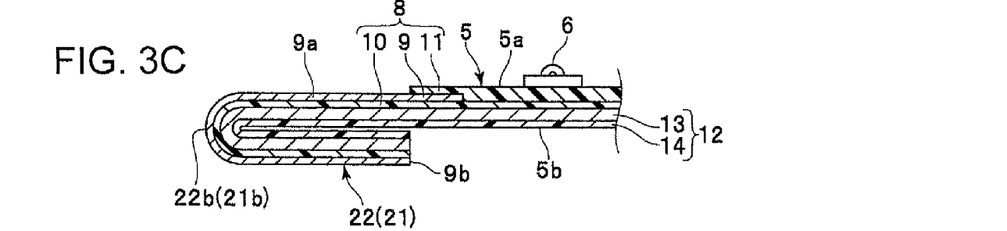
FIG. 3C is a cross-sectional view taken along the line 3C-3C in FIG. 3A.
Figure 4:
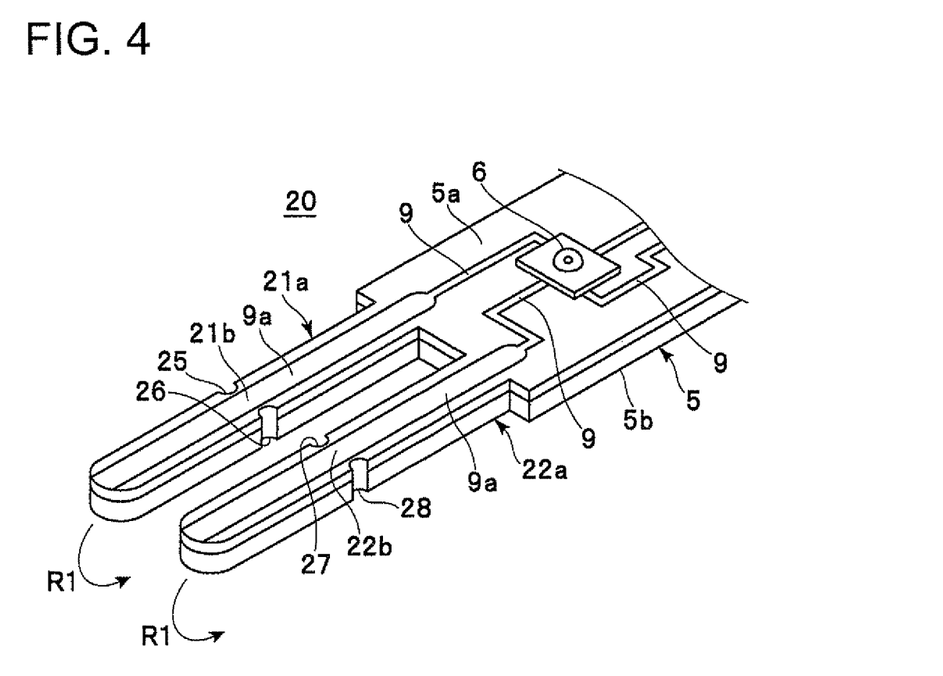
FIG. 4 is a perspective view that shows the illumination device according to the third embodiment of the present invention provided with cutout portions for bending formed on end portions of the metal base FPC.

Next, an illumination device according to the third embodiment of the present invention will be described based on FIG. 4, The illumination device 4 according to the third embodiment has cutout portions 25 to 28 for bending on the projection portions 21a and 22a that are shown in FIG. 3B of the third embodiment, but otherwise it has the same configuration as that of he second embodiment. The projection portions 21a and 22a of the third embodiment shown in FIG. 4 are respectively provided with the cutout portions 25 and 26 and the cutout portions 27 and 28 on the side surfaces located on the left and right of the center portions 21b. The cutout portions 25 and 26 and the cutout portions 27 and 28 shorten the width of the projection portions 21 a and 22a by cutting out the side surfaces of the projection portions 21 a and 22a in the up-down direction. By providing the cutout portions 25 to 28 on the left and right sides of the center portions 21b and 22b, the projection portions 21a and 22a can be easily bent toward the back surface 5b (in the direction of the reference symbols R1 in FIG. 4), using the center portions 21b and 22b as the bending points. Consequently, the terminal portions 21 and 22 as shown in FIG. 3A can be easily formed.

Next, an illumination device 30 according to the fourth embodiment of the present invention in which part of a metal base FPC 31 is formed by insert molding on a resin holding member 32 will be described based on FIGS. 5A and 5B.

The front surface 31a of the metal base FPC 31 is mounted with electronic components, including the light emitting element 6 and the lighting control circuit 7. In the resin holding member 32, a connector housing portion 33, a flange-shaped attachment portion 34 for a lamp body or the like, and an attachment shaft portion 35 of the metal base FPC 31 are integrally formed. The connector housing portion 33, as an example, has a cylindrical shape. The metal base FPC 31 has a back surface 31b in contact with the attachment shaft portion 35 and is disposed along the shape of the attachment shaft portion 35. The lighting control circuit 7 is disposed on a side surface of the attachment shaft portion 35. The light emitting element 6 is disposed facing in the direction of the center axis L1 of the holding member 32.

One end 36 of the metal base FPC 31 is fixed near the upper surface 34a of the attachment portion 34. The other end of the metal base FPC 31 is processed and formed with parts that are similar to the projection portions 21a and 22a of the second embodiment. A pair of projection portions 37 (and 38) provided on the other end of the metal base FPC 31 are brought from the upper surface 34a of the attachment portion 34 into the interior of the connector housing portion 33 to expose therein. The exposed projection portions 37 (and 38) are bent approximately 180 degrees toward the inner side of the connector housing portion 33 and, in this state, the distal end portions 37a and 38a thereof are fixed to the top surface 33a of the connector housing portion 33. The bent projection portions 37 (and 38) are formed as thick terminal portions 39 (and 40) as in the second and third embodiments. The number of the terminal portions (or electrodes) can be three instead of two, although the number of the electrodes is not limited to two or three. The thick terminal portions 39 (and 40), together with the connector housing portion 33, form a connector 41. The connector 41 of the illumination device 30 of this fourth embodiment is disposed on the center axis L1 of the holding member 32 so as to face in the reverse direction of the light emitting element 6.

Next, an illumination device 30' according to a modification of the fourth embodiment will be described based on FIG. 5C. The illumination device 30' differs from the illumination device 30 with respect to the connector 41, wherein a connector 41' is disposed facing in a perpendicular direction to the orientation of the light emitting element 6.

More specifically, the front surface 31a' of a metal base FPC 31' is mounted with electronic components, including the light emitting element 6 and the lighting control circuit 7. In a resin holding member 32', a connector housing portion 33', a flange-shaped attachment portion 34' for a lamp body or the like, and an attachment shaft portion 35' of the metal base FPC 31' are integrally formed.

The connector housing portion 33' and the attachment portion 34' are both formed as cylinders, and respectively include inner cylindrical portions 33a' and 34a' on inner sides thereof. The attachment shaft portion 35' is provided inside the inner cylindrical portion 34a'. The center axis L1' of the attachment shaft portion 35' is coaxial with the center axis of the attachment portion 34'. The center axis L2 of the inner cylindrical portion 33a' is perpendicular to the center axis of the inner cylindrical portion 34a'. A stepped portion 42 is provided along the center axis L2 to extend sideward of the attachment shaft portion 35' and projects toward the connector housing portion 33'. A male type lance portion 43 for fixing is provided below the connector housing portion 33'. By engaging the male type lance 43 with a recessed portion of a receiving-side member (not shown), the connector 41' is fixed so as not to be detached from a connector (not shown) of the receiving-side member.

The metal base FPC 31' has a back surface 31b' in contact with the stepped portion 42 and the attachment shaft portion 35', and it is disposed along the shapes of the stepped portion 42 and the attachment shaft portion 35'. The lighting control circuit 7 is disposed on a side surface of the attachment shaft portion 35'. The light emitting element 6 is disposed facing in the direction of the center axis L1' of the attachment shaft portion 35'.

One end 36' of the metal base FPC 31' is inserted into the through hole 32a' formed in the bottom portion of the holding member 32' and bent upward. The end 36' is thus retained by the recessed portion 32b' and fixed. Projection portions 37' (and 38') provided on the other end of the metal base FPC 31' are inserted into the through hole 33c' in the bottom portion of the connector housing portion 33a' and exposed to the inner side of the connector housing portion 33'. The exposed projection portions 37' (and 38') are bent approximately 180 degrees inside the connector housing portion 33' and respective distal end portions 37a' and 38a' thereof are fixed by being inserted into the insertion hole 33d' provided in the bottom portion 33b' of the connector housing portion 33'. The bent projection portions 37' (and 38') are formed as thick terminal portions 39' (and 40') as in the second and third embodiments. The number of the terminal portions (or electrodes) can be three instead of two, although the number of electrodes is not limited to two or three. The thick terminal portions 39' (and 40'), together with the connector housing portion 33', form the connector 41'. The connector 41' is disposed on the center axis L2 of the inner cylindrical portion 33a' that extend in a direction perpendicular to the orientation of the light emitting element 6.

Figure 6A:
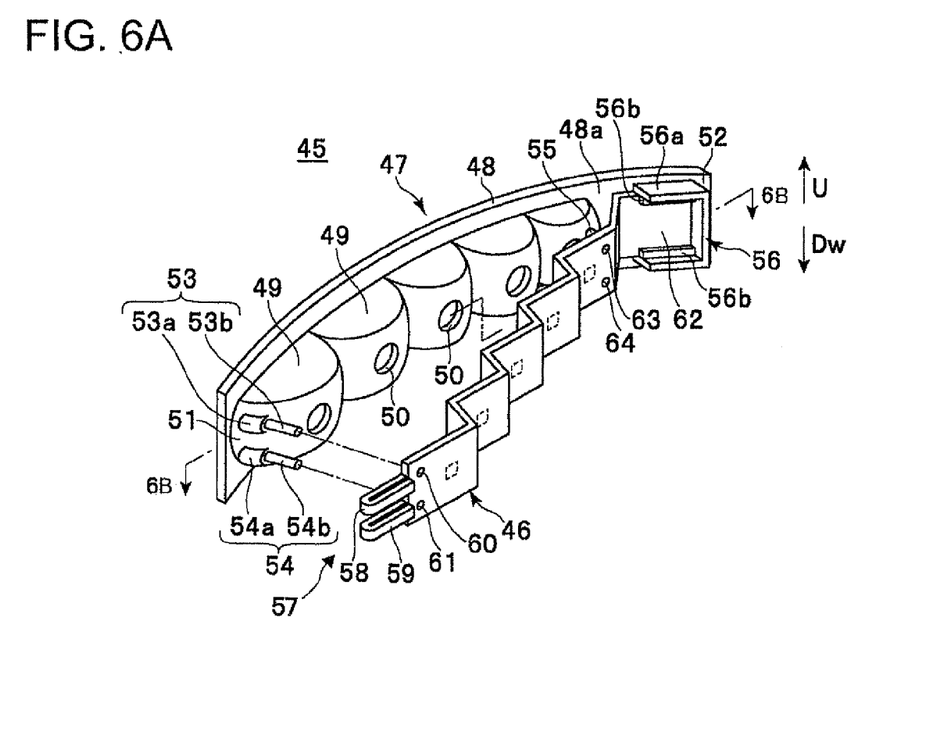
FIG. 6A is a perspective view of the illumination device under assembly process according to the fifth embodiment of the present invention.
Figure 6B:
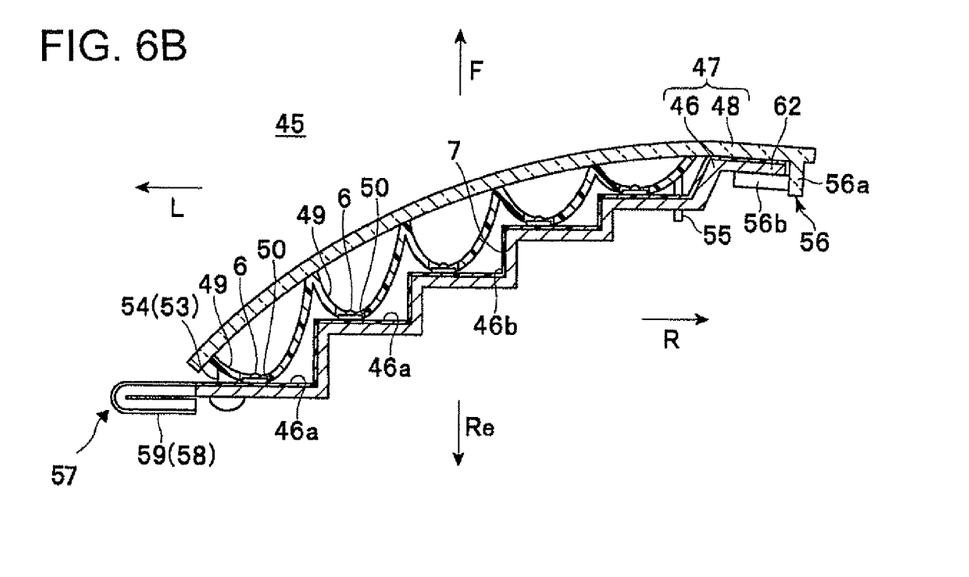
FIG. 6B is a cross-sectional view of the assembled illumination device taken along the line 6B-6B in FIG. 6A.

Next, an illumination device 45 according to the fifth embodiment of the present invention that is formed from a lens and a metal base FPC will be described based on FIGS. 6A and 6B. The illumination device 45 of the fifth embodiment is formed by a metal base FPC 46 and a lens 47. The metal base FPC 46 is mounted with a plurality of light emitting elements 6, the lighting control circuit 7, and the like. In the following description of the fifth embodiment, the direction of the reference symbol F denotes forward and the direction of the reference symbol Re denotes rearward in FIG. 6B, and the directions of the reference symbols L and R denote the left and right directions, respectively.

The lens 47 is formed from a front lens 48 and a plurality of reflectors 49 that project rearward in convex shapes and are continuous diagonally leftward toward the rear. These continuous reflectors 49 are each provided with an exposure hole 50 for receiving the light emitting element.

Support portions 53 and 54 for heat staking are provided near the left end portion 51 of the continuous reflectors 49. The support portions 53 and 54 are respectively formed by integrating thick, shaft-like mount portions 53a and 54a that are at the base end portions with narrow shaft portions 53b and 54b that are at the distal end portions.

An insertion holding portion 56 is provided near the right end portion 52 of the lens 47. The insertion holding portion 56 has the same cross-sectional shape as the right end portion 62 of the metal base FPC 46, so that the right end portion 62 of the metal base FPC 46 is slidingly inserted into and held by the insertion holding portion 56 of the lens 47. The insertion holding portion 56 is formed by a partition-like main body portion 56a and a pair of holding ribs 56b. The partition-like main body portion 56a positions the right end portion 62 of the metal base FPC 46 in the up-down direction (direction of the reference symbols U, Dw in FIG. 6A) and in the right direction, and the pair of holding ribs 56b are used so that the metal base FPC 46 is held between these holding ribs 56b and the back surface 48a of the front lens 48.

In addition, a pair of support shafts 55 (one of which is not shown) that project rearward are provided on the inner side of the insertion holding portion 56 of the lens 47.

The metal base FPC 46 is bent into a stepped configuration so as to follow the back surface (rear side) shape of the lens 47 (reflectors 49). The light emitting element 6 is mounted on each of a plurality of support surfaces 46a facing the lens 47. The lighting control circuit 7 is mounted on one of the connection surfaces 46b connecting the support surfaces 46a. A left end portion 57 of the metal base FPC 46 is provided with thick terminal portions 58 and 59 that are formed by bending the left end portion 180 degrees as in the second and third embodiments. The number of the terminal portions (electrodes) can be three instead of two, although the number of the electrodes is not limited to two or three.

Provided near the left end portion 57 of the metal base FPC 46 are insertion holes 60 and 61 into which the narrow shaft portions 53b and 54b of the holding portions 53 and 54 provided on the left end portion 51 of the lens 47 are respectively inserted.

Insertion holes 63 and 64 respectively receiving therein the support shafts 55 are provided on the support surface 46a that is disposed near the right end portion 62 of the metal base FPC 46.

The metal base FPC 46 is fixed to the lens 47 as follows. First, the right end portion 62 of the metal base FPC 46 is inserted into the insertion holding portion 56 of the lens 47. Next, the narrow shaft portions 53b and 54b on the left side of the lens 47 are respectively inserted into the insertion holes 60 and 61 of the metal base FPC 46, and the support shafts 55 on the right side of the lens 47 are inserted into the insertion holes 63 and 64 of the metal base FPC 46. The narrow shaft portions 53b and 54b inserted into the insertion holes 60 and 61 are heated and pressed (by heat staking), so that the metal base FPC 46 is fixed on the back surface side of the lens 47 (in the rearward Re direction). Each light emitting element 6 on the metal base FPC 46 is exposed through the exposure hole 50 to the front lens 48 side. The integrated metal base FPC 46 and the lens 47 form the illumination device 45.

The invention claimed is:

1. An illumination device including at least one of a light emitting element and a lighting control circuit on a metal base flexible printed circuit board (FPC) integrally comprised of a metal base having flexibility and a flexible printed circuit board that is formed by integrating a conductive body with a film, wherein
an end portion of the metal base FPC is formed as a thick terminal portion so that the end portion is greater in thickness than the metal base FPC.

2. The illumination device according to claim 1, wherein the end portion of the metal base FPC is bent to form the thick terminal portion.

3. The illumination device according to claim 2, wherein the end portion of the metal base FPC is provided with a cutout portion.

4. The illumination device according to claim 1, wherein
the metal base FPC is integrated with a resin holding member integrally provided with a connector housing portion, and
the thick terminal portion is disposed on an inner side of the connector housing portion.

5. The illumination device according to claim 2, wherein
the metal base FPC is integrated with a resin holding member integrally provided with a connector housing portion, and
the thick terminal portion is disposed on an inner side of the connector housing portion.

6. The illumination device according to claim 3, wherein
the metal base FPC is integrated with a resin holding member integrally provided with a connector housing portion, and
the thick terminal portion is disposed on an inner side of the connector housing portion.

7. The illumination device according claim 1, wherein
the metal base FPC is bent so as to follow a shape of a lens of a vehicular lamp, and integrated with a back surface side of the lens.

8. The illumination device according claim 2, wherein
the metal base FPC is bent so as to follow a shape of a lens of a vehicular lamp, and integrated with a back surface side of the lens.

9. The illumination device according to claim 3, wherein
the metal base FPC is bent so as to follow a shape of a lens of a vehicular lamp, and integrated with a back surface side of the lens.

10. The illumination device according to claim 4, wherein
the metal base FPC is bent so as to follow a shape of a lens of a vehicular lamp, and integrated with a back surface side of the lens.

11. The illumination device according to claim 5, wherein
the metal base FPC is bent so as to follow a shape of a lens of a vehicular lamp, and integrated with a back surface side of the lens.

12. The illumination device according to claim 6, wherein
the metal base FPC is bent so as to follow a shape of a lens of a vehicular lamp, and integrated with a back surface side of the lens.

* * * * *